United States Patent [19]

Ramanan

[11] Patent Number: 5,011,553

[45] Date of Patent: Apr. 30, 1991

[54] IRON-RICH METALLIC GLASSES HAVING HIGH SATURATION INDUCTION AND SUPERIOR SOFT FERROMAGNETIC PROPERTIES

[75] Inventor: V. R. V. Ramanan, Dover, N.J.

[73] Assignee: Allied-Signal, Inc., Morris Township, N.J.

[21] Appl. No.: 379,762

[22] Filed: Jul. 14, 1989

[51] Int. Cl.[5] .............................................. H01L 41/06

[52] U.S. Cl. .................................... 148/403; 148/108; 148/306

[58] Field of Search ......................... 148/403, 306, 108

[56] References Cited

U.S. PATENT DOCUMENTS

| | | | |
|---|---|---|---|
| 3,856,513 | 12/1974 | Chen et al. | 75/122 |
| 4,067,732 | 1/1978 | Ray | 75/126 P |
| 4,321,090 | 3/1982 | Datta et al. | 148/31.55 |
| 4,763,030 | 8/1988 | Clark et al. | 148/403 |

OTHER PUBLICATIONS

C. H. Smith, "Metallic Glasses in High Energy Pulsed Power Systems", *Glass Curr. Issues,* (NATO ASI Ser. E, #92), Nijhoff Pub. (1985) pp. 188–199.

*Primary Examiner*—Upendra Roy
*Attorney, Agent, or Firm*—Ernest D. Buff; Gerhard H. Fuchs; Richard C. Stewart

[57] ABSTRACT

A magnetic metallic glass alloy exhibits, in combination, high saturation induction and high Curie temperature. The alloy has a composition described by the formula $Fe_aCo_bNi_cB_dSi_eC_f$, where "a"- "f" are in atom percent, "a" ranges from about 75 to about 81, "b" ranges from 0 to about 6, "c" ranges from about 2 to about 6, "d" ranges from about 11 to about 16, "e" ranges from 0 to about 4, and "f" ranges from 0 to about 4, with the provisos that (i) the sum of "b" and "c" may not be greater than about 8, (ii) "d" may not be greater than about 14 when "b" is zero, (iii) "e" may be zero only when "b" is greater than zero, and (iv) "f" is zero when "e" is zero. This alloy is suitable for use in large magnetic cores used in various applications requiring high magnetization rates, and in the cores of line frequency power distribution transformers, airborne transformers, current transsformers, ground fault interrupters, switch-mode power supplies, and the like.

9 Claims, No Drawings

IRON-RICH METALLIC GLASSES HAVING HIGH SATURATION INDUCTION AND SUPERIOR SOFT FERROMAGNETIC PROPERTIES

BACKGROUND OF THE INVENTION

1. Field of the Invention

This invention relates to iron-rich metallic glass alloys having the combination of high saturation induction and high Curie temperatures, which results in superior soft ferromagnetic properties.

2. Description of the Prior Art

Glassy metal alloys (metallic glasses) are metastable materials lacking any long range order. They are conveniently prepared by rapid quenching from the melt using processing techniques that are conventional in the art. Examples of such metallic glasses and methods for their manufacture are disclosed in U.S. Pat. Nos. 3,856,513, 4,067,732 and 4,142,571. The advantageous soft magnetic characteristics of metallic glasses, as disclosed in these patents, have been exploited in their wide use as materials in a variety of magnetic cores, such as in distribution transformers, switch-mode power supplies, tape recording heads and the like.

Applications for soft magnetic cores, in a particular class now receiving increased attention, are generically referred to as pulse power applications. In these applications, a low average power input, with a long acquisition time, is converted to an output that has high peak power delivered in a short transfer time. In the production of such high power pulses of electrical energy, very fast magnetization reversals, ranging up to 100 T/μs, occur in the core materials. Examples of pulse power applications include saturable reactors for magnetic pulse compression and for protection of circuit elements during turn on, and pulse transformers in linear induction particle accelerators.

Metallic glasses are very well suited for pulse power applications because of their high resistivities and thin ribbon geometry, which allow low losses under fast magnetization reversals. (See, for example, (i) "Metallic Glasses in High-Energy Pulsed-Power Systems", by C. H. Smith, in *Glass . . . Current Issues,* A. F. Wright and J. Dupuy, eds., (NATO ASI Series E, No. 92, Martinus Nijhoff Pub., Dordrecht, The Netherlands, 1985) pp. 188–199.) Furthermore, metallic glasses, due to their non-crystalline nature, bear no magneto-crystalline anisotropy and, consequently, may be annealed to deliver very large flux swings, with values approaching the theoretical maximum value of twice the saturation induction of the material, under rapid magnetization rates. These advantageous aspects of metallic glass materials have led to their use as core materials in various pulse power applications: in high power pulse sources for linear induction particle accelerators, as induction modules for coupling energy from the pulse source to the beam of these accelerators, as magnetic switches in power generators for inertial confinement fusion research, and in magnetic modulators for driving excimer lasers.

Reference has been made to annealed samples in the discussion above. It is a well known fact in the art that metallic glasses have to be subjected to anneals (or, synonymously, heat treatments), usually in the presence of external magnetic fields imposed on the materials, before they display their excellent soft magnetic characteristics. The reason for these required anneals is that as-cast ribbons of metallic glasses tend to have high quenching stresses, resulting from the very rapid cooling rates employed to cast these materials. In the case of ferromagnetic metallic glasses, these stresses lead to a distribution of stress-induced magnetic anisotropy, which, in turn, tends to mask the true soft ferromagnetic properties realizable from these materials. To remedy this situation, metallic glasses must be annealed at suitably chosen temperatures, for appropriate time intervals, whereby the quenching stresses are relaxed while the glassy structure of these materials is preserved.

The purpose of the externally imposed fields during anneals is to induce a magnetic anisotropy, i.e., a preferred direction of magnetization. Accordingly, the anneal temperatures are chosen to be very close to the Curie temperatures of the materials, so that small, and practical, strengths (up to about 1600 A/m) may be used for the external fields. Since the beneficial effects due to annealing, such as stress relaxation, are a result of kinetic processes, a higher Curie temperature in the material allows for high anneal temperatures and therefore, shorter anneal times. Furthermore, a low anneal temperature with a longer anneal time may yet not fully relax the stresses, and a preferred anisotropy direction may not be fully established.

Another advantage of a higher Curie temperature in a ferromagnetic material is that the rate of reduction of the saturation induction with temperature is reduced, so that higher induction levels are available in the material at given device operating temperatures or, for a given induction level, the material may be driven to higher operating temperatures.

Most pulse power applications require a high saturation induction in the core material, which leads to large flux swings in the core. The core material should, preferably, also possess a low induced magnetic anisotropy energy. A low magnetic anisotropy energy leads to lower core losses, by facilitating the establishment of an optimal ferromagnetic domain structure, and therefore allows the cores to operate with greater efficiency.

High saturation induction levels are necessary in other applications for metallic glasses as well. Requirements for miniaturization of electronic components in, say, switch-mode power supplies, will be met by higher saturation induction levels, and line frequency distribution transformers may be designed to operate at higher induction levels.

METGLAS® 2605CO (nominal composition: $Fe_{66}Co_{18}B_{15}Si_{1}$), available from Allied-Signal Inc., is a high induction metallic glass alloy currently used in many of the pulse power applications recited above. This metallic glass is disclosed in U.S. Pat. No. 4,321,090, wherein metallic glasses having a high saturation induction are disclosed. The saturation induction of this glassy alloy, in the annealed state, is about 1.8 T. However, the high cobalt content in this alloy imparts a high value for the magnetic anisotropy energy and, consequently, high core losses. The value of about 900 J/m$^3$ for the magnetic anisotropy energy in this alloy is among the highest obtained in metallic glasses. In spite of its high induction, a maximum flux swing of only about 3.2 T is attainable from this alloy. Furthermore, the high Co content in this alloy leads to high raw material costs. Considering that cores used in pulse power applications may contain as much as 1000 kg of core material per core, and considering that Co had been classified as a strategic material, a more economical alloy containing substantially reduced levels of Co is highly desirable.

A metallic glass alloy that contains no cobalt is METGLAS® 2605SC (nominal composition: $Fe_{81}B_{13.5}Si_{3.5}C_2$), available from Allied-Signal Inc. This alloy is disclosed in U.S. Pat. No. 4,219,355. The low magnetic anisotropy energy (about 100 J/m$^3$) of this alloy has been exploited in a variety of applications, including certain pulse power applications. However, this alloy has a lower saturation induction (about 1.6 T in the annealed state) and a relatively low Curie temperature of about 620 K, when compared to other Fe-B-Si metallic glasses in the prior art.

A metallic glass alloy that offers a combination of high saturation induction, high Curie temperature and low anisotropy energy would be highly desirable for the purposes of many applications. An additional advantage would be derived if such an alloy were to offer economy in production costs.

SUMMARY OF THE INVENTION

The present invention provides iron-rich magnetic alloys that are at least about 80% glassy and exhibit, in combination, high saturation induction and high Curie temperature. Generally stated, the glassy metal alloys of the invention have a composition described by the formula $Fe_aCo_bNi_cB_dSi_eC_f$, where "a"- "f" are in atom percent, "a" ranges from about 75 to about 81, "b" ranges from 0 to about 6, "c" ranges from about 2 to about 6, "d" ranges from about 11 to about 16, "e" ranges from 0 to about 4, and "f" ranges from 0 to about 4, with the provisos that (i) the sum of "b" and "c" may not be greater than about 8, (ii) "d" may not be greater than about 14 when "b" is zero, (iii) "e" may be zero only when "b" is greater than zero, and (iv) "f" is zero when "e" is zero. In the alloys of the invention, the saturation induction ranges from about 1.5 T to about 1.65 T, and the Curie temperature is at least about 620 K.

The metallic glasses of this invention are suitable for use in large magnetic cores associated with applications requiring high magnetization rates. Examples of such applications include high power pulse sources for linear induction particle accelerators, induction modules for coupling energy from the pulse source to the beam of these accelerators, magnetic switches in power generators for inertial confinement fusion research, magnetic modulators for driving excimer lasers, and the like. Other uses include the cores of line frequency power distribution transformers, airborne transformers, current transformers, ground fault interrupters, switch-mode power supplies, and the like.

DESCRIPTION OF THE PREFERRED EMBODIMENTS

In accordance with the present invention, there are provided iron-rich magnetic metallic glass alloys that are at least about 80% glassy and exhibit, in combination, high saturation induction and high Curie temperature. Generally stated, the glassy metal alloys of the invention have a composition described by the formula $Fe_aCo_bNi_cB_dSi_eC_f$, where "a" - "f" are in atom percent, "a" ranges from about 75 to about 81, "b" ranges from 0 to about 6, "c" ranges from about 2 to about 6, "d" ranges from about 11 to about 16, "e" ranges from 0 to about 4, and "f" ranges from 0 to about 4, with the provisos that (i) the sum of "b" and "c" may not be greater than about 8, (ii) "d" may not be greater than about 14 when "b" is zero, (iii) "e" may be zero only when "b" is greater than zero, and (iv) "f" is zero when "e" is zero. The purity of the above compositions is that found in normal commercial practice. In the alloys of the invention, the saturation induction ranges from about 1.5 T to about 1.65 T, and the Curie temperature is at least about 620 K.

Since the presence of even small fractions of crystallinity in an otherwise glassy alloy tends to impair the optimal soft magnetic performance of the alloy, the alloys of the invention are preferably at least 90% glassy, and most preferably 100% glassy, as established by X-ray diffraction. Furthermore, the glassy alloys of the invention that evidence a saturation induction of at least about 1.55 T are especially preferred for most of the applications cited above.

Examples of metallic glasses of the invention include $Fe_{81}Ni_2B_{13.5}Si_{3.5}$, $Fe_{79}Ni_4B_{14}Si_3$, $Fe_{79}Ni_6B_{12}Si_3$, $Fe_{77}Ni_4B_{14}Si_3C_2$, $Fe_{75}Ni_4B_{14}Si_3C_4$, $Fe_{77}Co_4Ni_2B_{14}Si_3$, $Fe_{77}Co_2Ni_4B_{14}Si_3$, $Fe_{75}Co_6Ni_2B_{14}Si_3$, $Fe_{78}Co_2Ni_2B_{12}Si_2C_4$, $Fe_{80}Co_3Ni_2B_{12}Si_3$ and $Fe_{81}Co_1Ni_2B_{16}$.

The importance of a high Curie temperature and its role in the establishment of practical and efficient anneal conditions, and the importance of a high saturation induction in allowing higher operating induction levels and facilitating miniaturization of electronic components has already been discussed.

The importance of a high saturation induction in an alloy targeted for use in pulse power applications, such as a magnetic switch, may be understood as follows: Given that the units for saturation induction are volt-second per meter squared (Vs/m$^2$), [1 (Vs/m$^2$) = 1 T], a magnetic core of a given cross-sectional area will "hold off" a known amount of Vs from the output. Therefore, under a fixed input voltage level, the hold-off time is greater when the core material has a greater saturation induction.

The presence of Ni in the alloys of the invention has been found to increase the Curie temperatures over values found in alloys that do not contain Ni. It has also been found that this benefit arises without any substantial effects on the saturation induction of the alloys. In many instances, the saturation induction values are indeed increased as a result of the presence of Ni. The increase in the Curie temperature due to the presence of Ni is not found beyond a Ni content of about 6 at.%. In fact, the values of the Curie temperature begin to drop above about 4 at.% Ni. It has also been found that when the B content of the alloys exceeds about 14 at.%, the Curie temperature values are reduced. The saturation induction levels also begin to drop, particularly at higher Ni contents.

The presence of cobalt in the alloys of the invention also serves to increase the Curie temperature and the saturation induction, though the increases in the latter are only slight. Importantly, it has been found that the presence of Co allows the presence of greater levels of B (about 16 at.%) in the alloy before serious penalties are incurred in the values for saturation induction.

It is believed that the presence of Co in an iron-rich metallic glass tends to increase the magnetic anisotropy energy of the alloy. This is important in certain applications wherein a very high squareness is desired in the hysteresis loop of the material. However, since higher values for the anisotropy energy are usually concurrent with a degradation in properties such as core loss of the material, alloys containing less than about 4 at.% Co are preferred alloys of the invention.

The alloys of the invention that contain no Co are most preferred alloys of the invention, because of the substantial cost of the element.

The presence of C in the alloys of the invention serves to further enhance the Curie temperature of the alloys. This effect of C is diminished and penalties are incurred in saturation induction levels, when the C content of the alloys exceeds about 4 at.%. Additionally, the presence of C in the alloys of the invention improves the melt handling characteristics of an iron-rich alloy melt. In large scale production of rapidly solidified metallic glass ribbons, improved handling characteristics of the alloy melt are important. It has been found that the presence of C in the alloys of the invention helps to reduce the magnetic anisotropy energy of the alloys. Consequently, alloys containing C represent another set of preferred alloys of the invention.

TABLE I

Values for the saturation induction, $B_s$, and the Curie temperature, $T_c$, of selected metallic glass alloys. The first named alloy falls outside the scope of this invention.

| Composition (at. %) | $B_s$ (T) | $T_c$ (K) |
|---|---|---|
| $Fe_{81}B_{13.5}Si_{3.5}C_2$ | 1.57 | 619 |
| $Fe_{81}Ni_2B_{13.5}Si_{3.5}$ | 1.61 | 631 |
| $Fe_{77}Ni_4B_{14}Si_3C_2$ | 1.58 | 662 |
| $Fe_{77}Ni_6B_{14}Si_3$ | 1.55 | 657 |
| $Fe_{75}Co_6Ni_2B_{14}Si_3$ | 1.57 | 692 |

The above described effects of Ni, Co and C are illustrated by example in Table I, which lists the values for the saturation induction and the Curie temperature of selected alloys.

The effect of Si in the alloys of the invention is to reduce the saturation induction but increase the thermal stability of the glassy state of the alloys by increasing their crystallization temperatures. The maximum level of about 4 at.% Si in the alloys of this invention defines an acceptable balance between these two effects of Si.

The following examples are presented to provide a more complete understanding of the invention. The specific techniques, conditions and reported data set forth to illustrate the principles and practice of the invention are exemplary and should not be construed as limiting the scope of the invention. All alloy compositions described in the examples are nominal compositions.

EXAMPLES

Glassy metal alloys, designated as samples no. 1 to 11 in Table II and samples no. 1 to 14 in Table III, were rapidly quenched from the melt following the techniques taught by Narasimhan in U.S. Pat. No. 4,142,571, the disclosure of which is hereby incorporated by reference thereto. All casts were made in a vacuum chamber, using 0.025 to 0.100 kg melts comprising constituent elements of high purity. The resulting ribbons, typically 25 to 30 μm thick and about 6 mm wide, were determined to be free of crystallinity by x-ray diffractometry using Cu-$K_\alpha$ radiation and differential scanning calorimetry. Each of the alloys was at least 80% glassy, most of them more than 90% glassy and, in many instances, the alloys were 100% glassy. Ribbons of these glassy metal alloys were strong, shiny, hard and ductile. A commercial vibrating sample magnetometer was used for the measurement of the saturation magnetic moment of these alloys. As-cast ribbon from a given alloy was cut into several small squares (approximately 2 mm×2 mm), which were randomly oriented about a direction normal to their plane, their plane being parallel to a maximum applied field of about 755 kA/m. By using the measured mass density, the saturation induction, $B_s$, was then calculated. The density of many of these alloys was measured using standard techniques invoking Archimedes' Principle.

The Curie temperature was determined using an inductance technique. Multiple helical turns of copper wire in a fiberglass sheath, identical in all respects, (length, number and pitch) were wound on two open-ended quartz tubes. The two sets of windings thus prepared had the same inductance. The two quartz tubes were placed in a tube furnace, and an ac exciting signal (with a fixed frequency ranging between about 1 kHz and 20 kHz) was applied to the prepared inductors, and the balance (or difference) signal from the inductors was monitored. A ribbon sample of the alloy to be measured was inserted into one of the tubes, serving as the "core" material for that inductor. The high permeability of the ferromagnetic core material caused an imbalance in the values of the inductances and, therefore, a large signal. A thermocouple attached to the alloy ribbon served as the temperature monitor. When the two inductors were heated up in the furnace, the imbalance signal essentially dropped to zero when the ferromagnetic metallic glass passed through its Curie temperature and became a paramagnet (low permeability). The two inductors were about the same again. The transition region is usually broad, reflecting the fact that the stresses in the as-cast glassy alloy are relaxing. The mid point of the transition region was defined as the Curie temperature.

In the same fashion, when the furnace was cooled, the paramagnetic to ferromagnetic transition could be detected. This transition, from the at least partially relaxed glassy alloy, was usually much sharper. The paramagnetic to ferromagnetic transition temperature was higher than the ferromagnetic to paramagnetic transition temperature. In Tables I to III, for all the alloys cited, the quoted values for the Curie temperature represent the ferromagnetic to paramagnetic transition.

The values for the saturation induction quoted in Tables I to III, for all alloys, are those obtained from as-cast ribbons. It is well understood in the art that the saturation induction of an annealed metallic glass alloy is usually higher than that of the same alloy in the as-cast state, for the same reason as stated above: the glass is relaxed in the annealed state.

TABLE II

Values for saturation induction, $B_s$, and Curie temperature, $T_c$, obtained from various Fe—Ni—B—Si—C metallic glasses belonging to this invention. A density of 7.35 × $10^3$ ($kg/m^3$) has been assumed in calculating $B_s$.

| No. | | Fe | —Ni | —B | —Si | —C | $B_s$(T) | $T_c$(K) |
|---|---|---|---|---|---|---|---|---|
| 1 | at. % | 81 | 2 | 14 | 3 | 0 | 1.61 | 636 |
| | wt. % | 92.6 | 2.4 | 3 | 1.4 | 0 | | |
| 2 | at. % | 78 | 2 | 16 | 4 | 0 | 1.58 | 661 |
| | wt. % | 91.5 | 2.5 | 3.6 | 2.4 | 0 | | |
| 3 | at. % | 81 | 4 | 12 | 3 | 0 | 1.57 | 647 |
| | wt. % | 91.0 | 4.7 | 2.6 | 1.7 | 0 | | |
| 4 | at. % | 79 | 4 | 13.5 | 3.5 | 0 | 1.61 | 659 |
| | wt. % | 90.2 | 4.8 | 3.0 | 2.0 | 0 | | |
| 5 | at. % | 79 | 6 | 12 | 3 | 0 | 1.59 | 624 |
| | wt. % | 88.6 | 7.1 | 2.6 | 1.7 | 0 | | |
| 6 | at. % | 77 | 6 | 14 | 3 | 0 | 1.55 | 657 |
| | wt. % | 88.0 | 7.2 | 3.1 | 1.7 | 0 | | |
| 7 | at. % | 79 | 2 | 13.5 | 3.5 | 2 | 1.58 | 661 |
| | wt. % | 92.0 | 2.4 | 3.0 | 2.0 | 0.5 | | |

TABLE II-continued

Values for saturation induction, $B_s$, and Curie temperature, $T_c$, obtained from various Fe—Ni—B—Si—C metallic glasses belonging to this invention. A density of $7.35 \times 10^3$ ($kg/m^3$) has been assumed in calculating $B_s$.

| No. | | Fe | —Ni | —B | —Si | —C | $B_s$(T) | $T_c$(K) |
|---|---|---|---|---|---|---|---|---|
| 8 | at. % | 79 | 4 | 12 | 3 | 2 | 1.56 | 646 |
| | wt. % | 90.3 | 4.8 | 2.7 | 1.7 | 0.5 | | |
| 9 | at. % | 78 | 4 | 14 | 3 | 1 | 1.58 | 666 |
| | wt. % | 90.0 | 4.9 | 3.1 | 1.7 | 0.2 | | |
| 10 | at. % | 76 | 4 | 14 | 3 | 3 | 1.58 | 683 |
| | wt. % | 89.3 | 4.9 | 3.2 | 1.8 | 0.8 | | |
| 11 | at. % | 75 | 4 | 14 | 3 | 4 | 1.57 | 678 |
| | wt. % | 89.0 | 5.0 | 3.2 | 1.8 | 1.0 | | |

TABLE III

Values for saturation induction, $B_s$, and Curie temperature, $T_c$, obtained from various Fe—Co—Ni—B—Si—C metallic glasses belonging to this invention. A density of $7.35 \times 10^3$ ($kg/m^3$) has been assumed in calculating $B_s$.

| No. | | Fe | —Co | —Ni | —B | —Si | —C | $B_s$ (T) | $T_c$ (K) |
|---|---|---|---|---|---|---|---|---|---|
| 1 | at. % | 75 | 2 | 6 | 14 | 3 | 0 | 1.51 | 681 |
| | wt. % | 85.6 | 2.4 | 7.2 | 3.1 | 1.7 | 0 | | |
| 2 | at. % | 79 | 2 | 2 | 14 | 3 | 0 | 1.52 | 657 |
| | wt. % | 90.4 | 2.4 | 2.4 | 3.1 | 1.7 | 0 | | |
| 3 | at. % | 80 | 1 | 2 | 14 | 3 | 0 | 1.53 | 631 |
| | wt. % | 91.6 | 1.2 | 2.4 | 3.1 | 1.7 | 0 | | |
| 4 | at. % | 81 | 2 | 2 | 13 | 2 | 0 | 1.54 | 628 |
| | wt. % | 91.3 | 2.4 | 2.4 | 2.8 | 1.1 | 0 | | |
| 5 | at. % | 81 | 1 | 2 | 14 | 2 | 0 | 1.50 | 624 |
| | wt. % | 91.9 | 1.2 | 2.4 | 2.9 | 1.7 | 0 | | |
| 6 | at. % | 80 | 3 | 2 | 12 | 3 | 0 | 1.54 | 644 |
| | wt. % | 89.8 | 3.6 | 2.4 | 2.6 | 1.7 | 0 | | |
| 7 | at. % | 77 | 4 | 2 | 14 | 3 | 0 | 1.54 | 654 |
| | wt. % | 88.0 | 4.8 | 2.4 | 3.1 | 1.7 | 0 | | |
| 8 | at. % | 81 | 2 | 1 | 16 | 0 | 0 | 1.55 | 633 |
| | wt. % | 92.8 | 2.4 | 1.2 | 3.5 | 0 | 0 | | |
| 9 | at. % | 81 | 2 | 1 | 14 | 2 | 0 | 1.56 | 635 |
| | wt. % | 92.2 | 2.4 | 1.2 | 3.1 | 1.1 | 0 | | |
| 10 | at. % | 77 | 2 | 4 | 14 | 3 | 0 | 1.56 | 670 |
| | wt. % | 88.0 | 2.4 | 4.8 | 3.1 | 1.7 | 0 | | |
| 11 | at. % | 81 | 2 | 1 | 13 | 3 | 0 | 1.56 | 627 |
| | wt % | 91.9 | 2.4 | 1.2 | 2.9 | 1.7 | 0 | | |
| 12 | at. % | 75 | 6 | 2 | 14 | 3 | 0 | 1.57 | 692 |
| | wt. % | 85.6 | 7.2 | 2.4 | 3.1 | 1.7 | 0 | | |
| 13 | at. % | 79 | 3 | 3 | 12 | 1 | 2 | 1.65 | 635 |
| | wt. % | 89.2 | 3.6 | 3.6 | 2.6 | 0.6 | 0.5 | | |

TABLE III-continued

Values for saturation induction, $B_s$, and Curie temperature, $T_c$, obtained from various Fe—Co—Ni—B—Si—C metallic glasses belonging to this invention. A density of $7.35 \times 10^3$ ($kg/m^3$) has been assumed in calculating $B_s$.

| No. | | Fe | —Co | —Ni | —B | —Si | —C | $B_s$ (T) | $T_c$ (K) |
|---|---|---|---|---|---|---|---|---|---|
| 14 | at. % | 78 | 2 | 2 | 12 | 2 | 4 | 1.62 | 659 |
| | wt. % | 90.3 | 2.4 | 2.4 | 2.7 | 1.2 | 1.0 | | |

Having thus described the invention in rather full detail, it will be understood that such detail need not be strictly adhered to but that further changes and modifications may suggest themselves to one skilled in the art, all falling within the scope of the invention as defined by the subjoined claims.

What is claimed is:

1. A magnetic metallic glass alloy that is at least about 80% glassy and characterized by the presence, in combination of high saturation induction and high Curie temperature, having a composition described by the formula $Fe_aCo_bNi_cB_dSi_eC_f$, where "a" - "f" are in atom percent, "a" ranges from about 75 to about 81, "b" ranges from 0 to about 6, "c" ranges from about 2 to about 6, "d" ranges from about 11 to about 16, "e" ranges from 0 to about 4, and "f" ranges from 0 to about 4, with the provisos that (i) the sum of "b" and "c" may not be greater than about 8, (ii) "d" may not be greater than about 14 when "b" is zero, (iii) "e" may be zero only when "b" is greater than zero, and (iv) "f" is zero when "e" is zero.

2. The magnetic alloy of claim 1, wherein "b" ranges from 0 to about 4.

3. The magnetic alloy of claim 1, wherein "f" is greater than zero.

4. A magnetic core wherein said core has as its core material a metallic glass alloy having a composition as recited in claim 1.

5. The magnetic alloy of claim 2, wherein "b" is zero.

6. The magnetic alloy of claim 3, wherein "b" is zero.

7. The magnetic alloys of claims 1, 2, 5 or 3 having the composition $Fe_{81}Ni_2B_{13.5}Si_{3.5}$, $F_{79}Ni_4B_{14}Si_3$, $Fe_{79}Ni_6B_{12}Si_3$, $Fe_{77}Ni_4B_{14}Si_3C_2$, $Fe_{75}Ni_4B_{14}Si_3\ C_4$, $Fe_{77}Co_4Ni_2B_{14}Si_3$, $Fe_{77}Co_2Ni_4B_{14}Si_3$, $Fe_{75}Co_6Ni_2\ B_{14}Si_3$, $Fe_{80}Co_3Ni_2B_{12}Si_3$ and $Fe_{81}Co_1Ni_2B_{16}$.

8. The magnetic core of claim 4, wherein said core material has a composition as recited in claim 5.

9. The magnetic core of claim 4, wherein said core material has a composition as recited in claim 3.

* * * * *